United States Patent [19]

Tan et al.

[11] Patent Number: 5,545,057
[45] Date of Patent: Aug. 13, 1996

[54] INTERCONNECTION SYSTEM WITH I/O CONNECTOR MODULE BOARD

[75] Inventors: Haw-Chan Tan, Diamond Bar; Tim S. L. Chang, Chino Hills, both of Calif.

[73] Assignee: Hon Hai Precision Ind. Co., Ltd., Taiwan

[21] Appl. No.: 250,366

[22] Filed: May 27, 1994

[51] Int. Cl.⁶ .................................................. H05K 1/14
[52] U.S. Cl. .................................... 439/540.1; 439/65
[58] Field of Search ............................... 439/61, 62, 76, 439/65, 540; 361/683, 686, 785

[56] References Cited

U.S. PATENT DOCUMENTS

| | | | |
|---|---|---|---|
| 4,421,372 | 12/1983 | Golden | 439/296 |
| 4,742,477 | 5/1988 | Phillips et al. | 361/686 |
| 4,744,006 | 5/1988 | Duffield | 361/686 |

OTHER PUBLICATIONS

IBM Technical Disclosure, vol. 33, No. 8, p. 430, Planar I/O Port, Jan. 1991.

Primary Examiner—Neil Abrams

[57] ABSTRACT

An interconnection system for use with a computer set comprises a connector module PC board (10) on which most I/O connectors (12) are integrated to be mounted. A first mating section (18) is positioned adjacent the bottom edge of the PC board (10) and adapted to mate with a second mating section (22) of a main board (20) in the computer set. A frame (24) is formed on the back side of the computer case, and such connector module PC board (10) is securely but detachably attached to the frame (24). As an alternative to connector (18) contact pads (15) at the bottom edge of the board (10) are usable to mate with a vertically positioned connector on the main board (20). In another embodiment (FIG. 4) a right angle adapter (54) is used to electrically join a connector module PC board (50) to a main board (56).

4 Claims, 4 Drawing Sheets

INTERCONNECTION SYSTEM WITH I/O CONNECTOR MODULE BOARD

BACKGROUND OF THE INVENTION

1. Field of the Invention

The invention relates to interconnection systems, especially to an I/O port assembly unit for use with the backpanel of the computer set wherein such I/O port assembly unit integrates most I/O connectors with a board so that it is easy for computer manufacturers to install I/O connectors within the computer set.

2. The Prior Art

The conventional personal computer set interconnect the peripheries through plural I/O (Input/Output) connectors positioned on the backpanel of the computer case. As known, each I/O connector is mounted on a front edge portion of an expansion card which is received within an expansion slot, i.e., a card edge connector mounted on the mother board. Generally, there are eight expansion slots installed on the mother board for being adopted to receive the corresponding inserted cards. Correspondingly, there are eight openings side by side arranged in the backpanel of the computer case, and each opening incorporates a strap-like bracket for securing the corresponding I/O connectors thereof and allowing such connector protrude outwardly from the corresponding opening. Each strap-like bracket is individually securely screwed to a frame which has been already fastened to the inner side of the backpanel of the computer case. To a computer manufacturer who buys components and assembles them together, fastening such brackets to the frame and connectors to the brackets take labor and time, thus increasing the cost.

Additionally, the expansion cards and the corresponding expansion slots generally take too much space in the computer case and on the main board. Therefore, it is desired to have an I/O port assembly which integrates all the backpanel I/O connectors and such corresponding expansion cards and expansion slots together as a compact unit so that the whole size of the computer set can be reduced to meet the requirement of miniaturization trend in this field.

Therefore, an object of the invention is to provide an I/O interconnection system integrating the individual I/O connectors, which originally are separately and respectively connected to the corresponding parallel expansion cards, on a PC board, whereby such interconnection system can not only efficiently reduce the dimension of the computer set, but also simplify the operation of assembling the I/O ports to the computer case for a computer manufacturer.

SUMMARY OF THE INVENTION

According to an aspect of the invention, an interconnection system for use with a computer set comprises a connector module PC board on which most I/O connectors are integrated to be mounted. A first mating section is positioned adjacent the bottom edge of the PC board and adapted to mate with a second mating section of a main board of the computer set. A frame is formed on the back side of the computer case, and such connector module PC board is securely but detachably attached to the frame. Therefore, it takes much less space in a computer case so that the dimension of the computer set can be reduced greatly. Moreover, it is easier for a computer manufacturer to assemble the I/O ports to the computer set, and to change such I/O connector module PC board thereof for repairing or upgrading.

DETAILED DESCRIPTION OF THE PREFERRED EMBODIMENT

References will now be made in detail to the preferred embodiments of the invention. While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by appended claims.

Figure 1:
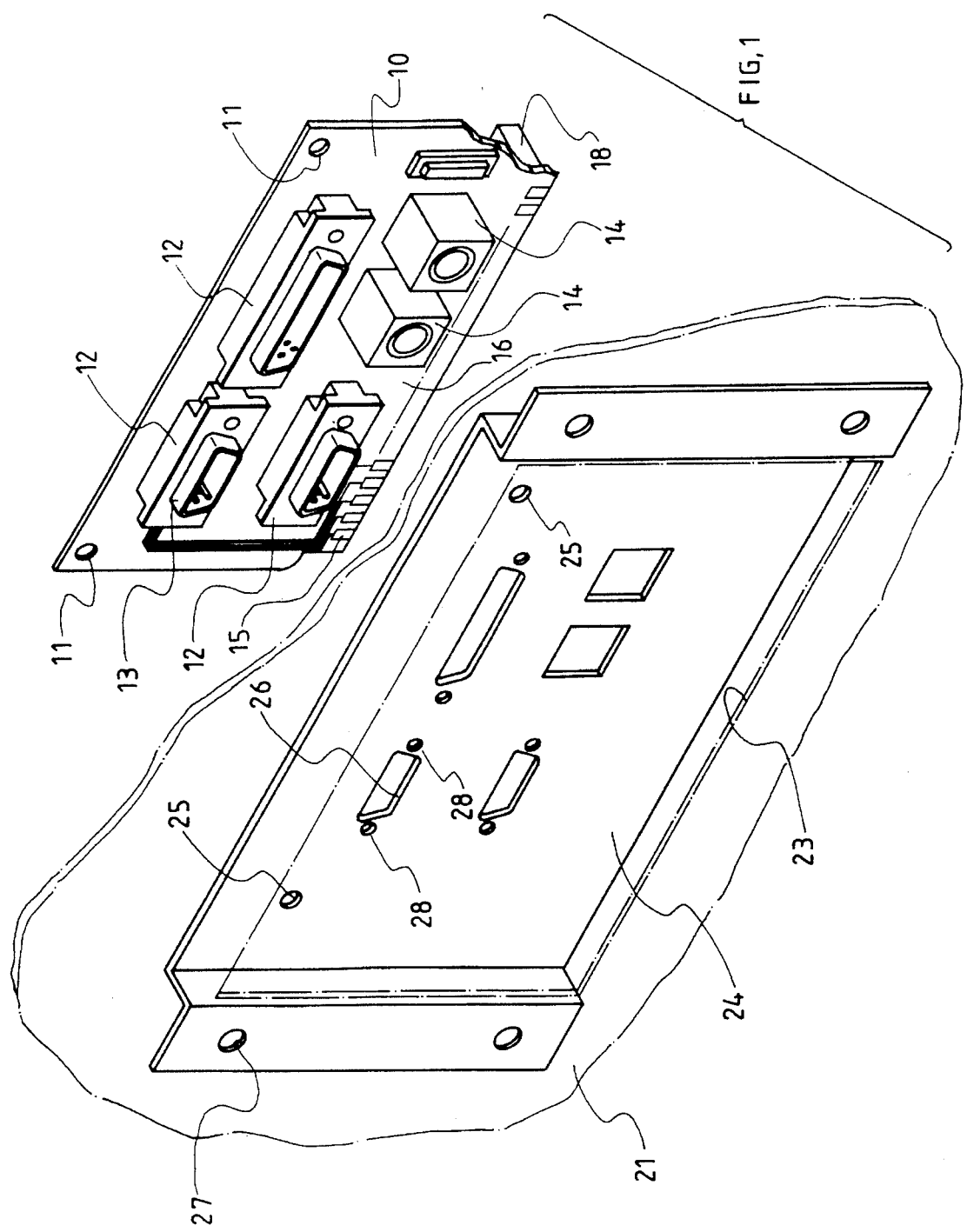
FIG. 1 is an exploded perspective view of a presently preferred embodiment of an I/O connector module PC board with part broken away and incorporating the frame and the backpanel of the computer case, according to the invention.
Figure 2:
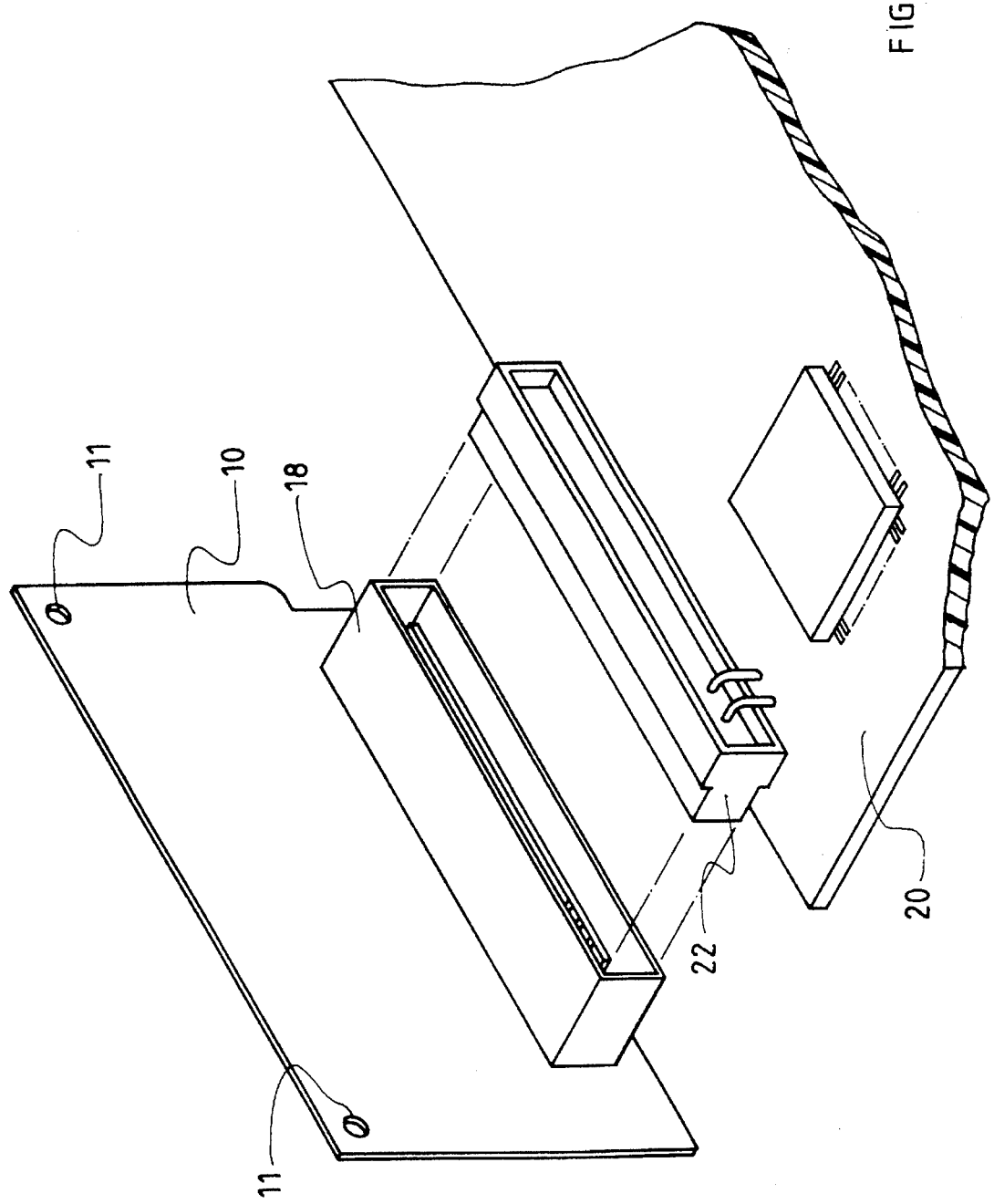
FIG. 2 is a perspective view from the back side to show the mating connectors on the first module PC board in FIG. 1 and on the second main board.

It can be seen that in FIGS. 1–4, only two or three contacts are shown in the corresponding connectors and such few contacts stand for the rest ones thereof. Attention is now directed to FIGS. 1 and 2 wherein an interconnection system of a computer set includes a vertical connector module PC (first) board 10 integrating the corresponding I/O circuits and components thereon and on which several I/O D-Sub connectors 12 and circular Din connectors 14 are solderably mounted. The circuit traces 15 on the board 10 are terminated at the bottom edge portion of the board 10 and a mating section 16 is formed thereof. A male connector 18 is positioned on the back side of the mating section 16 of the board 10 for coupling to the corresponding circuit traces thereof.

A main PC (second) board 20 is horizontally positioned in the lower portion of the computer case (not shown) for adaptation to the connector 18. A female connector 22 is positioned at an end of the board 20 for mating with the male blade-like connector 18 on the board 10. Through the mating of the male connector 18 and the female card edge connector 22, the signals transferred in-and out via such I/O D-Sub and Din connectors 12, 14 can be transmitted between the CPUs on the main board 20, and the exterior peripheries such as the printer, the monitor, the key board or the like.

A plate-like frame 24 is tightly attached, by screws (not shown) through the apertures 27, to a periphery of an opening 23 of the backpanel 21 of the computer case (not shown), and the connector module PC board 10 is fixed to such frame 24 by screws (not shown) through apertures 11 in the PC board 10 and apertures 25 in the frame 24. The frame 24 has plural openings 26 therein each for compliance with the profile of the front portion 13 of the corresponding connector 12 or 14 so that such front portion 13 of the connector 12 or 14 can protrude out of frame 24 for mating with a cable connector which is connected to the periphery.

In this embodiment, there are two opposite apertures 28 by two sides of each D-Sub connector opening 26 for reception of a pair of socket head screws (not shown), respectively. Through such socket head screw's fastening, this direct securement of such D-Sub connectors 12 with regard to the frame 24 can reinforce the stability of the D-Sub connectors 12 in the computer case (not shown). Alternately, without such reinforcement, the D-Sub connector 12 can still be firmly in its position with regard to the frame 24 through its soldering on the board 10 and such board 10 being fastened to the frame 24 by the screw's securement in apertures 11 in the PC board 10 and apertures 25 in the frame 24.

Understandably, the fingers 15 may be adapted to engage the corresponding contacts of an adaptor 54 (FIG. 4) in an alternative embodiment.

Figure 3:
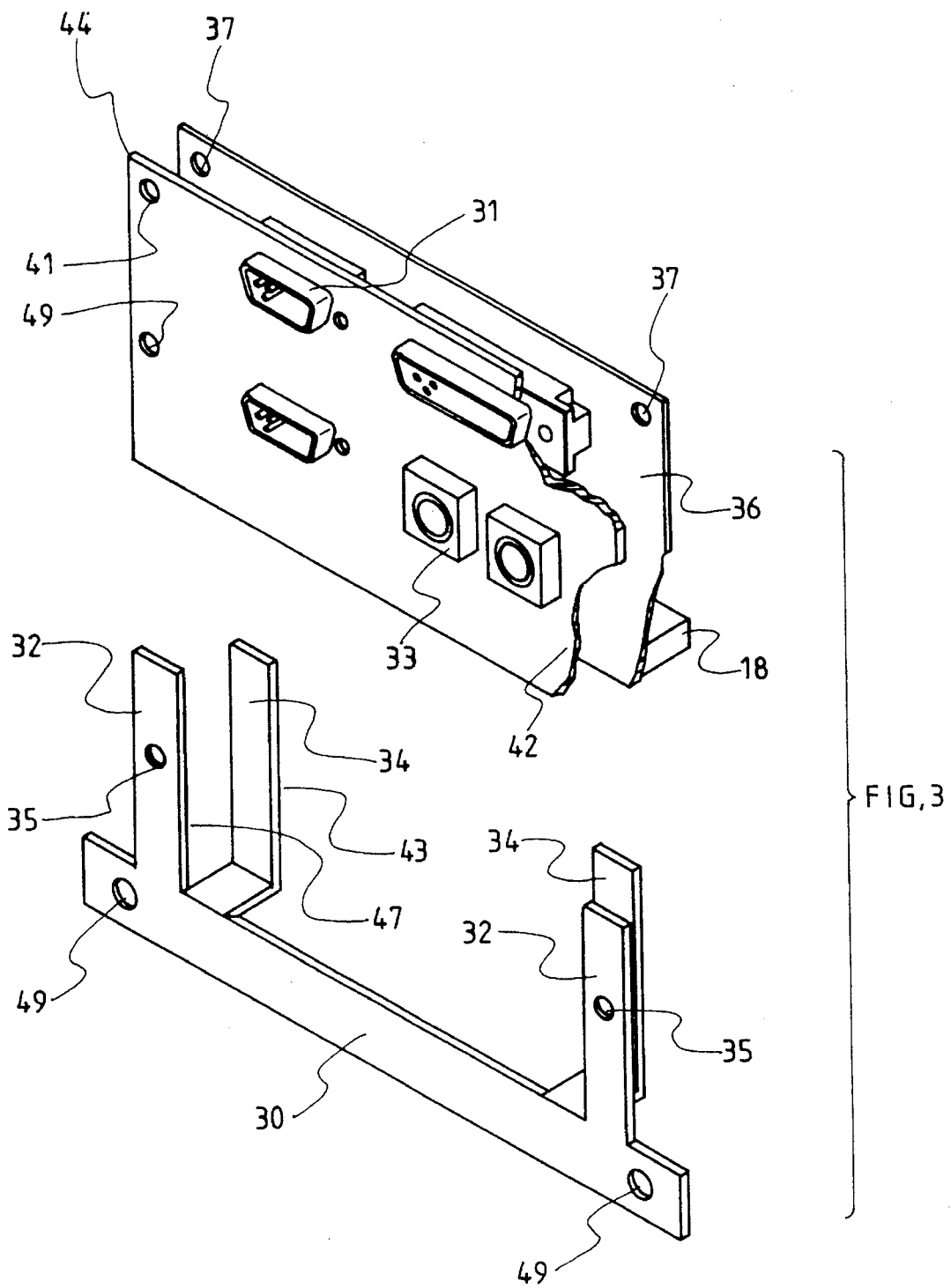
FIG. 3 is a second embodiment of the invention with parts broken away, to show an preassembled I/O assembly unit and its associated frame of the computer case.
Figure 4:
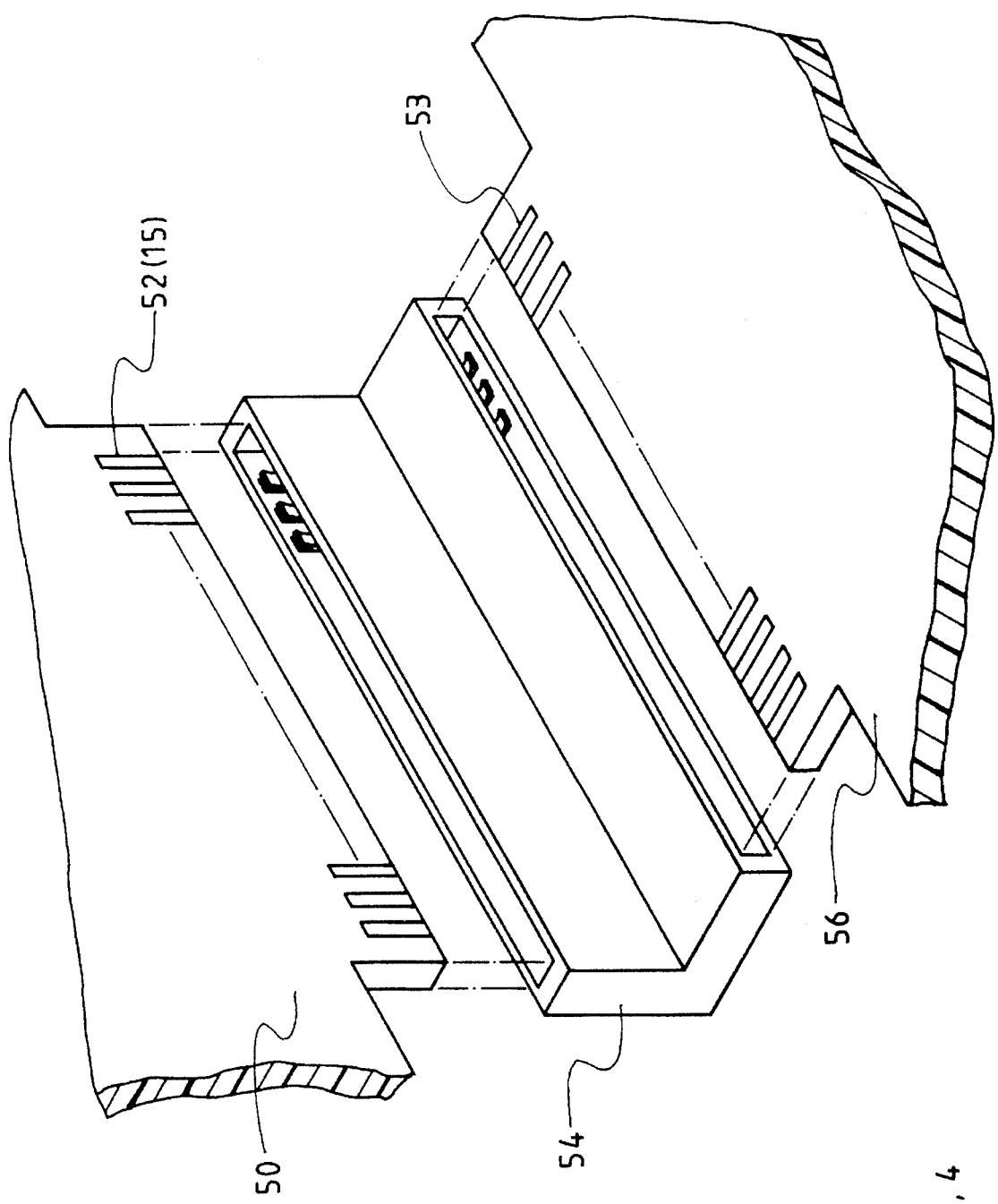
FIG. 4 is a third embodiment of the invention to show an adaptor coupling the module PC board and the main board with each other.

FIG. 3 shows a second embodiment of the invention disclosing the computer case includes a frame 30 of the backpanel thereof wherein the backpanel of the computer set can be referred to FIG. 1. The frame 30 is composed of two sets of spaced vertical outer and inner legs 32, 34. Similar to the board 10, the connector module PC board 36 comprises a female card edge connector (18) on the back side of its bottom edge portion for receiving the gold fingers portion 53 of the main board 56 wherein the main board 56 and its gold fingers portion 53 are shown in FIG. 4. In this embodiment, a metal panel 42 is fastened to the PC board 36 through screws (not shown) penetrating the corresponding apertures 37 within the board 36 and apertures 41 within the panel 42 wherein the connectors 31, 33 are not only soldered on the PC board 36 but also are secured to and protrude out of such panel 42 in the way as the connectors 12, 14 are mounted to the frame 24 in the first embodiment. In this condition, the connectors 12, 14 are generally sandwiched between the board 36 and the panel 42. Thus, the metal panel 42 accompanies the PC board 36 and its associated connectors 31, 33 to form an pre-assembled I/O assembly unit 44 which can be inserted, through a top loading, into the space between such two sets of spaced parallel legs 32, 34. In other words, the preassembled I/O assembly unit 44 can be sandwiched between such two sets of legs 32, 34. The metal panel 42 can be fixed to the frame 30 by screws (not shown) through apertures 49 in the panel 42 and apertures 35 in the outer legs 32 so that the whole I/O unit 44 can be secured to the computer case. In this situation, the connectors 31, 33 can be open to the exterior through the opening 47 defined by the two outer legs 32, and the back side connector (not shown) protrudes through the opening 43 defined by the two inner legs 34 for reception of gold fingers portion 53 of the main board 56.

FIG. 4 depicts a third embodiment of the invention wherein similar to the second embodiment, there is a metal panel accompanying the PC board 50 and its associated I/O connectors to form an I/O assembly unit. Different from the I/O unit 44 in the second embodiment, the I/O module PC board 50 of the I/O assembly unit in this embodiment has no card edge connector on the back at the bottom but is replaced by the gold fingers portion 52 thereof. A right angle type adaptor 54 is positioned at the intersection portion of the backpanel and the bottom plate of the computer case for respectively horizontally and vertically receiving the gold fingers portions 52, 53 of the main board 56 and of the PC board 50.

It can be appreciated that the feature of the invention is that all the I/O ports can be integrated to be a pre-assembled one piece such that the expansion cards and the corresponding expansion slots (i.e., the side-by-side arranged parallel card edge connectors) can be eliminated. Thus, almost one third of the area of the main board can be saved where the expansion slots are originally disposed. Certainly, the main board in the present invention may includes some circuit traces and components related to the I/O matters which are originally comprised in the traditional expansion cards. The dimension reduction of the main board can result in miniaturization of the whole computer set. Additionally, such I/O assembly unit is designedly vertically positioned adjacent the backpanel of the computer case so that the dimension of the structure of the assembled computer sets can be arranged as compact as possible to comply with the trend of miniaturization.

It can be understood that the I/O assembly unit in the present invention is installed within the computer case, and the appearance of the whole computer set and the use of such exposed I/O ports of the computer set are still similar to those of the conventional type. So, the presently disclosed invention will not confuse or disturb the ordinary user who is familiar to the traditional computer. In contrast, the present invention which may be fabricated by a connector manufacturer, provides the computer manufacturer with a one-piece pre-assembled I/O assembly unit or package which can allow the computer manufacturer, who buys the components and assembles such components together, not necessarily to spend too much labor and time in fastening the separate plural connectors onto the backpanel of the computer as before because of pre-assembling of such I/O unit.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

Therefore, persons of ordinary skill in this field are to understand that all such equivalent structures are to be included within the scope of the following claims.

What is claimed is:

1. An interconnection system for use with I/O ports in a computer case, comprising:

a pre-assembled I/O assembly unit including a first I/O module board having I/O circuits and components thereof, a plurality of I/O connectors mounted on said first board, and a metal panel to which the first board is attached so that said connectors are generally sandwiched between the panel and the first board;

a second main board comprising CPUs thereon;

connection means positioned proximate the first board and the second board for interconnecting the first board and the second board with each other; and a frame positionable on a backpanel of the computer case wherein said pre-assembled I/O assembly unit is securely located adjacent to said frame and communicates with an exterior, and wherein said frame includes two sets of spaced legs for sandwiching said I/O assembly unit therebetween.

2. The interconnection system as described in claim 1, wherein said connection means includes an right angle adaptor for respectively receiving gold fingers of the first board and of the second board.

3. The interconnection system as described in claim 1, wherein said I/O assembly unit is disposed close to and parallel to the backpanel in the computer case and perpendicular to the main board.

4. An interconnection system for use with I/O ports in a computer case, comprising:

a pre-assembled I/O assembly unit including a first I/O module board having I/O circuits and components thereon, a plurality of I/O connectors mounted on said first board, and a metal panel to which the first board is attached so that said connectors are generally sandwiched between the panel and the first board;

a second main board comprising CPUs thereon;

connection means positioned proximate the first board and the second board for interconnecting the first board and the second board with each other; and a frame positionable on a backpanel of the computer case wherein said pre-assembled I/O assembly unit is securely located adjacent to said frame and communicates with an exterior, and wherein said connection means includes an right angle adaptor for respectively receiving gold fingers of the first board and of the second board.

* * * * *